United States Patent
Nonaka

[11] Patent Number: 6,165,587
[45] Date of Patent: Dec. 26, 2000

[54] MICROBRIDGE STRUCTURE WITH REINFORCEMENT SECTION

[75] Inventor: Ken-Ichi Nonaka, Saitama, Japan

[73] Assignee: Honda Giken Kogyo Kabushiki Kaisha, Tokyo, Japan

[21] Appl. No.: 09/150,329

[22] Filed: Sep. 9, 1998

[30] Foreign Application Priority Data

Sep. 9, 1997 [JP] Japan ................................. 9-284208
Aug. 26, 1998 [JP] Japan ............................... 10-239874

[51] Int. Cl.⁷ ................ B32B 7/00; B32B 3/00; G01J 5/00; H01L 29/06; H01L 21/76
[52] U.S. Cl. ................ 428/119; 428/195; 428/201; 250/338.1; 438/401; 257/619
[58] Field of Search ................ 428/156, 163, 428/176, 119, 195, 201; 257/36, 522, 170, 446, 621, 619, 623; 250/338.4, 370.01, 338.1, 332; 438/401; 338/15

[56] References Cited

U.S. PATENT DOCUMENTS

| 5,260,225 | 11/1993 | Liut .............................. 437/3 |
| 5,286,976 | 2/1994 | Cole ............................ 250/348 |
| 5,300,915 | 4/1994 | Higashi et al. .............. 338/22 R |
| 5,367,167 | 11/1994 | Keenan ........................ 250/338.4 |
| 5,399,897 | 3/1995 | Cunningham et al. ....... 257/467 |
| 5,551,293 | 9/1996 | Boysel et al. ................ 73/514.14 |

FOREIGN PATENT DOCUMENTS

| 62-113035 | 5/1987 | Japan . |
| 7-043216 | 2/1995 | Japan . |
| 8285680 | 11/1996 | Japan . |
| 1019671 | 1/1998 | Japan . |
| 10-122950 | 5/1998 | Japan . |
| 10-163510 | 6/1998 | Japan . |
| 10-185681 | 7/1998 | Japan . |
| 10-288550 | 10/1998 | Japan . |
| 9401743 | 1/1994 | WIPO . |

*Primary Examiner*—Ellis Robinson
*Assistant Examiner*—Laura L. Lee
*Attorney, Agent, or Firm*—Carrier, Blackman & Associates, P.C.; Joseph P. Carrier; William D. Blackman

[57] ABSTRACT

A microbridge structure includes a thin film section provided to be spaced from a substrate, and a supporting section formed around the thin film section and also spaced from the substrate, for supporting the thin film section. The supporting section is reinforced by a first reinforcement section, and the thin film section is reinforced by a second reinforcement section.

22 Claims, 5 Drawing Sheets

MICROBRIDGE STRUCTURE WITH REINFORCEMENT SECTION

BACKGROUND OF THE INVENTION

1. Field of the Invention

The present invention relates to a microbridge structure in which a thin film section spaced from a substrate is supported by a supporting section.

2. Description of the Related Art

As an example of devices which use a microbridge structure, a non-cooling type infrared image microbridge sensor is known.

FIG. 1 is a diagram illustrating a sensor element of a conventional non-cooling type infrared ray image sensor which is manufactured using an IC manufacturing technique. The sensor element is composed of a sensor section 2 and supporting sections 3 and 4. FIG. 2 is a perspective view which shows the shape of a part of the supporting sections 3 and 4 of the conventional sensor element.

In the infrared image sensor, a plurality of sensor elements typically arranged in a 2-dimensional matrix. Each sensor element is formed as shown in FIG. 1. The sensor element is of a bolometer type in which the change of a resistance value of the sensor section 2 caused by heating. of infrared rays which are incident to the sensor section 2 is taken out as an electric signal. In order to decrease the sensor sensitivity, the sensor section 2 is formed to have a microbridge structure in which the sensor section 2 is spaced from a substrate 1.

Also, a sensor resistance pattern 5 which is composed of material whose resistance value changes depending upon temperature is formed on the surface of the sensor section 2. A pattern 8 which is composed of the same material as that of the sensor resistance pattern 5 is formed on each of the supporting sections 3 and 4. The detecting result of the sensor section 2 is electrically connected to an output circuit (not illustrated) which is formed on the substrate 1, as a sensor signal through the supporting sections 3 and 4. At least one of the following matters must be implemented to improve the sensor sensitivity. That is, (1) a quantity of infrared rays which are absorbed by the sensor section 2 is increased, (2) noise which is generated in the sensor section 2 is reduced, and (3) heat insulation of the sensor section 2 is improved. In order to improve a responsivity in addition to the sensor sensitivity, it is necessary to make thermal capacity of the sensor section 2 small.

In order to decrease thermal capacity of the sensor section 2, it could be considered that material with a small specific heat is used for the sensor section 2, that the film thickness of the sensor section 2 is made thin, and that the area of the sensor section 2 is made small. However, silicon oxide or silicon nitride is generally used for the sensor section 2 for the reason of the manufacturing process wed to form same. Thus, the materials which may be used to form to the sensor section 2 are limited as a practical matter. Also, the area of the sensor section 2 cannot be made small sometimes. In order for the incident infrared rays to be absorbed sufficiently, there is a case that the area of the sensor section 2 is made large.

In the such case, in order to decrease the thermal capacity of the sensor section 2, the sensor section 2 must be made thin. However, when the sensor section 2 is spaced from the substrate 1, a problem lies in making the film thickness of the sensor section 2 thin from the viewpoint of strength of the sensor section 2.

Paying attention to the supporting sections 3 and 4, it is necessary that a material with low thermal conductivity is used in forming same and the supporting sections 3 and 4 can be made thin, narrow and long, to accomplish heat isolation of the sensor section 2. However, materials which can be used in the micromachining process are limited and the supporting sections 3 and 4 have materials used thereof and strength thereof.

In this way, in the infrared sensor element adopting the bridge structure in which the sensor section 2 is spaced from the substrate 1 by the two supporting sections 3 and 4, the heat isolation and thermal capacity of the sensor section 2 have a trade off relation with the strength of the sensor section 2 in structure.

SUMMARY OF THE INVENTION

The present invention is accomplished to solve the above problems. Therefore, an object of the present invention is to provide a microbridge structure in which the mechanical strength of a supporting section is improved.

Also, another object of the present invention is to provide a microbridge structure in which the mechanical strength of a thin film section is improved in addition to that of the supporting section.

In order to achieve an aspect of the present invention, a microbridge structure comprises a thin film section adapted to be provided in spaced relation to a substrate, a supporting section formed around the thin film section and also adapted to be spaced from the substrate, for supporting the thin film section, and the supporting section including at least one reinforcement section.

In order to achieve another aspect of the present invention, a microbridge structure comprises a thin film section which is adapted to be provided in spaced relation to a substrate, a supporting section formed around the thin film section and also adapted to be spaced from the substrate, for supporting the thin film section, and reinforcing means for reinforcing the supporting section and the thin film section. The reinforcement means includes a reinforcement section provided to at least a part of a peripheral portion of the thin film section.

The reinforcement section may be a stepped section which is provided to one of the sides of the supporting section in a longitudinal direction, or the reinforcement section may be provided to both sides of the supporting section in a longitudinal direction.

The reinforcement section may be formed as a unit with the supporting section to have an inverted T-shaped cross section or to have a T-shaped cross section. The reinforcement section having the inverted T-shaped cross section or the T-shaped cross section is desirably formed in at least a part of the peripheral portion of the thin film section.

DESCRIPTION OF THE PREFERRED EMBODIMENTS

A microbridge structure of the present invention will be described below in detail with reference to the attached drawings using a non-cooling type infrared sensor element as an example.

The infrared sensor which adopts the microbridge structure according to the first preferred embodiment of the present invention will be described. In the infrared sensor according to the first embodiment of the present invention, a plurality of infrared ray sensor elements are preferred arranged in a matrix (not shown).

Figure 3:
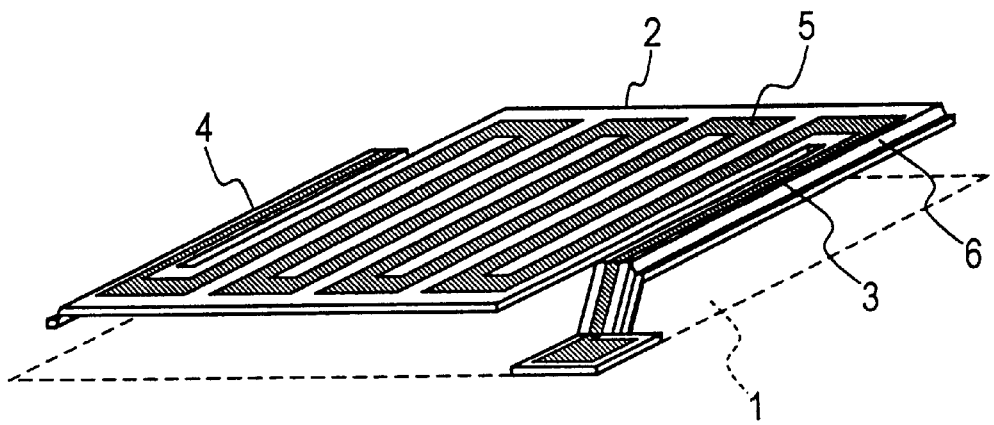
FIG. 3 is a perspective view which shows the structure of the infrared sensor element to which a microbridge structure according to the first preferred embodiment of the present invention is applied.

FIG. 3 is a perspective view which shows the structure of an infrared sensor element of the infrared sensor according to the first embodiment of the present invention. The infrared sensor is of a bolometer type in which the change of the resistance value of a resistance pattern 5 caused by the heat of incident infrared rays is outputted as an electric signal. Referring to FIG. 3, the infrared sensor element in the first embodiment will be described.

In FIG. 3, the infrared sensor element includes an infrared sensor section 2 as a thin film section which is provided above a semiconductor substrate 1 to be spaced from the substrate 1. The sensor section 2 is formed to have the bridge structure.

The sensor section 2 is preferably composed of silicon nitride and silicon oxide, and formed as thin as possible to decrease the thermal capacity thereof. In this way, the sensor sensitivity and response speed of the sensor section 2 can be improved.

On the surface of the sensor section 2 is formed the sensor resistance pattern 5 which changes its resistance value depending upon temperature. When the infrared rays are inputted, the heat of the infrared rays changes the resistance value of the sensor resistance pattern 5, and the change in the resistance value is detected. Therefore, it is desirable that a material having a high temperature coefficient is used as the material of the sensor resistance pattern 5. In the first embodiment, metals such as titanium or semiconductor such as vanadium oxide are preferably used as the material of the sensor resistance pattern 5.

Figure 1:
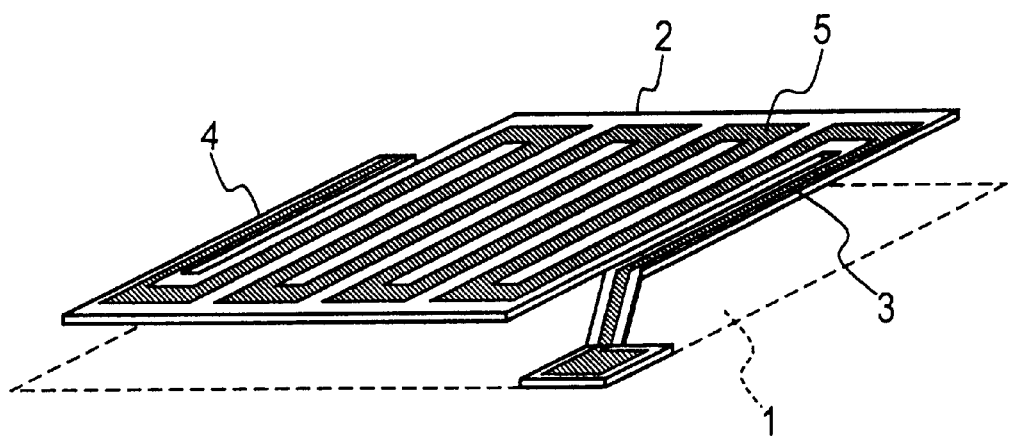
FIG. 1 is a perspective view which shows the structure of a conventional infrared sensor element with a microbridge structure.

A circuit section (not shown) to process the electrical signal from the sensor section 2 is provided on the surface of the substrate 1 under the sensor section 2. As shown in FIG. 1, supporting sections 3 and 4 are provided around the sensor section 2 to connect the detecting result from the sensor section 2 to the circuit section of the substrate 1. Each of the supporting sections 3 and 4 extends along one side of the sensor section 2 and is finally connected to the substrate 1. It should be noted that the supporting sections 3 and 4 may be provided to surround the sensor section 2.

Also, in addition to functioning as the connection for the detection result, the supporting sections 3 and 4 support the sensor section 2 such that the sensor section 2 is spaced from the substrate 1. In this way, the sensor section 2 and the supporting sections 3 and 4 from substantially rectangular area.

As shown in FIG. 3, the pattern 8 which is composed of the same material as the sensor resistance pattern 5 of the sensor section 2 is formed on each of the supporting sections 3 and 4. By this, the sensor section 2 and the circuit section formed on the substrate 1 are electrically connected through the supporting sections 3 and 4.

It should be noted that the circuit section need not be provided under the sensor section 2 as described above, but instead a circuit for the plurality of infrared sensor elements of the sensor may be collectively provided in another area. In this case, a wiring pattern from the supporting sections 3 and 4 to the circuit section is preferably formed on the surface of the substrate 1.

Also, when the sensor section 2 is formed to have a small area, the supporting sections 3 and 4 may be provided to surround the sensor section 2. In this case, the supporting sections 3 and 4 can be elongated so that the heat insulation of the sensor section 2 can be further improved.

As mentioned above, the infrared sensor of the present invention is the infrared sensor of the non-cooling type adopting the microbridge structure in which the sensor section 2 is spaced from the substrate 1.

Figure 4:
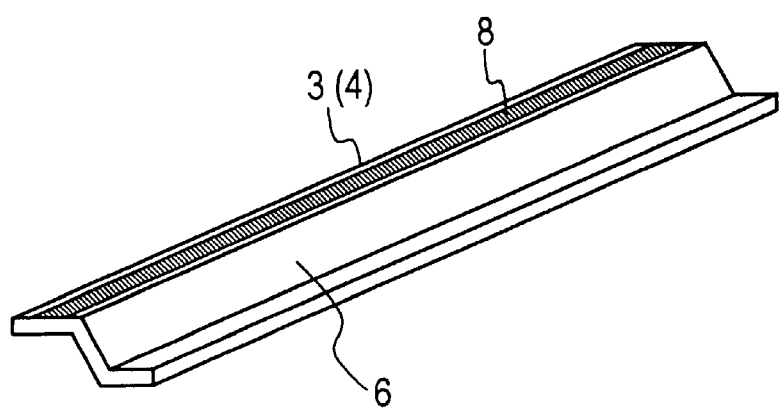
FIG. 4 is a perspective view which shows a part of the supporting section which is used in the infrared sensor element to which the microbridge structure according to the first embodiment of the present invention is applied.

FIG. 4 is a perspective view which shows a reinforcement step 6 which is provided along one of the sides of each supporting section 3 and 4 in a longitudinal direction. In the infrared sensor of the present invention, it is necessary for increasing of the sensor sensitivity of the sensor section 2 that the supporting sections 3 and 4 are made thin, narrow and long. Such structure increases a thermal resistance so that the heat insulation of the sensor section 2 can be increased. However, if the supporting sections 3 and 4 are made merely thin, narrow and long, the mechanical strength of the supporting sections 3 and 4 becomes weak so that the possibility that the infrared sensor element is damaged increases. Therefore, the reinforcement step 6 is formed along one of the sides of each supporting section in the longitudinal direction. The sensor element of the present invention can increase the high structural strength of the sensor element by 1 digit or more, compared with the conventional sensor element in which the supporting section is formed of a flat plate.

Figure 5:
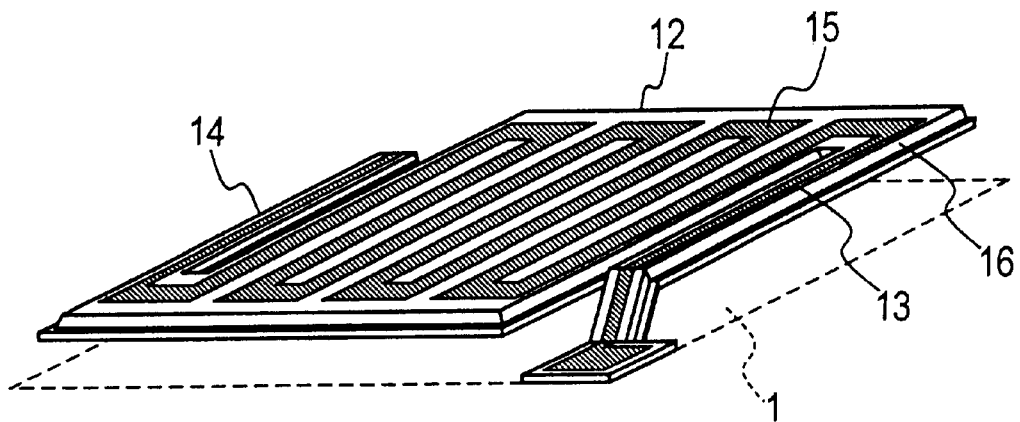
FIG. 5 is a perspective view which shows the structure of the infrared sensor element to which the microbridge structure according to the second preferred embodiment of the present invention is applied.

Next, the microbridge structure according to the second preferred embodiment of the present invention will be described with reference to FIGS. 5 and 6.

Figure 6:
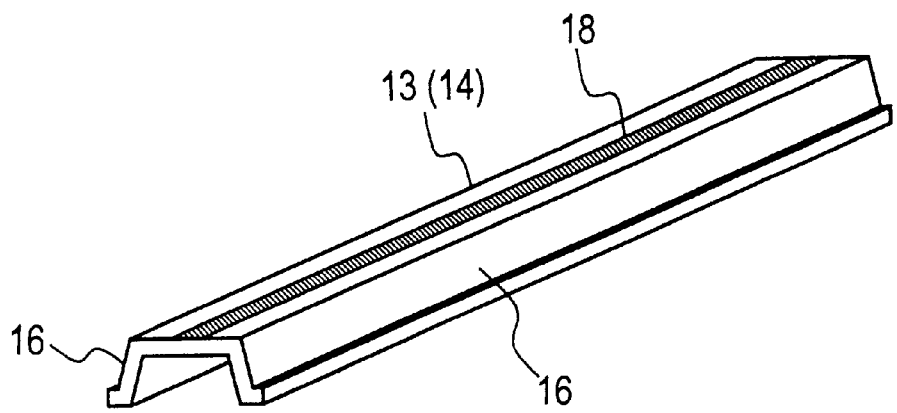
FIG. 6 is a perspective view which shows a part of the supporting section which is used in the infrared sensor element to which the microbridge structure according to the second embodiment of the present invention is applied.

As shown in FIG. 6, in the microbridge structure in the second embodiment, the reinforcement step 16 is formed along both sides of the supporting sections 13 and 14 in the longitudinal direction. Also, As shown in FIG. 5, the reinforcement step 16 is provided around the sensor section 12. In this case, the sensor section 12 can be made thin so that the thermal capacity of the sensor section 12 can be made small. In this way, the supporting sections 13 and 14 and the sensor section 12 can achieve the high strength structure.

Figure 7:
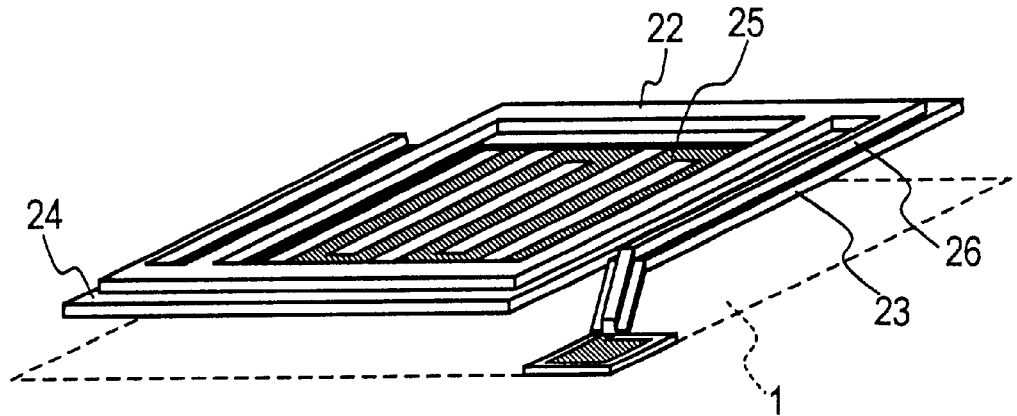
FIG. 7 is a perspective view which shows the structure of the infrared sensor element to which the microbridge structure according to the third preferred embodiment of the present invention is applied.
Figure 8:
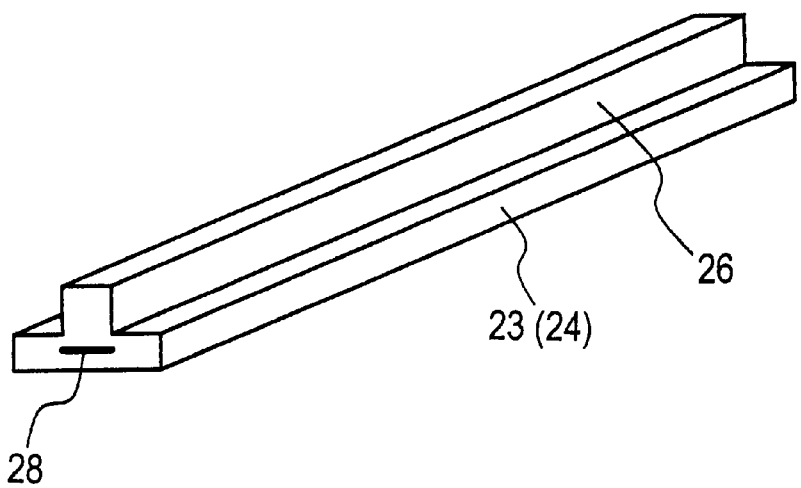
FIG. 8 is a perspective view which shows a part of the supporting section which is used with the infrared sensor element to which microbridge structure according to the third embodiment of the present invention is applied.
Figure 9:
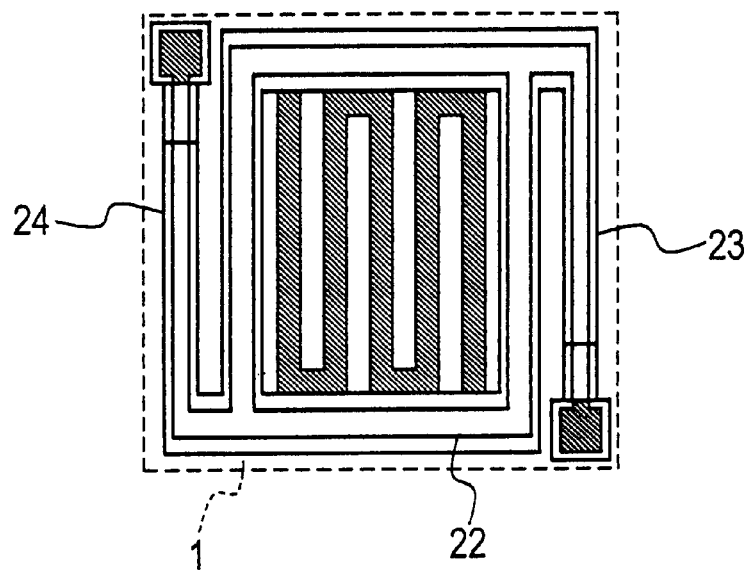
FIG. 9 is a plan view which shows the structure of the infrared sensor element to which the microbridge structure according to the third embodiment of the present invention is applied.

Next, the microbridge structure according to the third preferred embodiment of the present invention will be described with reference to FIGS. 7, 8 and 9. FIG. 7 is a perspective view which shows the microbridge structure according to the third embodiment of the present invention. FIG. 8 is a cross sectional perspective view to explain the supporting section which is used in the third embodiment. FIG. 9 is a plan view which shows the microbridge structure according to the third embodiment of the present invention.

As seen from FIG. 8, the supporting sections 23 and 24 have an inverted T character shape. The pattern 28 which is provided for each supporting section 23 or 24 is embedded in the inverted T character shape. The reinforcement section 26 having the inverted T character shape is provided in the peripheral section of the sensor section 22. The center section of the sensor section 22 which is surrounded by the reinforcement section 26 having the inverted T character shape is exposed. As a result, even if the reinforcement section is formed around the sensor section 22, the reinforcement section does not prevent the operation of the sensor section 22. In this way, the sensor section 22 as the thin film section is improved in strength. It should be noted that the sensor resistor pattern 25 may also be embedded in the sensor section 22.

It should be noted that in the third embodiment, the reinforcement section 26 is formed around the whole peripheral portion of the sensor section 22. However, the reinforcement section 26 may be partially provided around the sensor section 22. Even in the case, the reinforcement effect of the sensor section 22 can be achieved.

Figure 2:
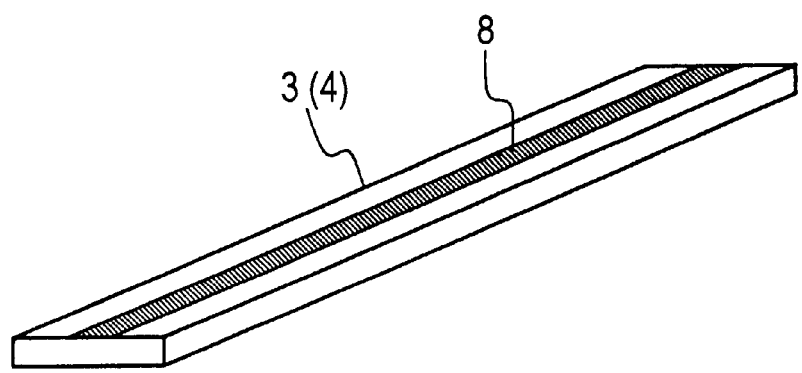
FIG. 2 is a perspective view which shows a part of the supporting section which is used in the conventional infrared sensor element to which microbridge structure according to the third preferred embodiment of the present invention is applied.

The reinforcement section of the supporting section according to each of the preferred embodiments can be formed by laminating an upper layer which is composed of the same material as the supporting section, on the conventional supporting section as a lower layer which is shown in FIG. 2 and then by performing a dry etching method to the upper and lower layer. Anisotropic etching such as reactive ion etching (RIE) is desirable as the etching for the above purpose. When the material of the upper layer is different from that of the lower layer, it is sufficient for the dry etching to be performed while changing the condition of the dry etching for every layer.

Figure 10:
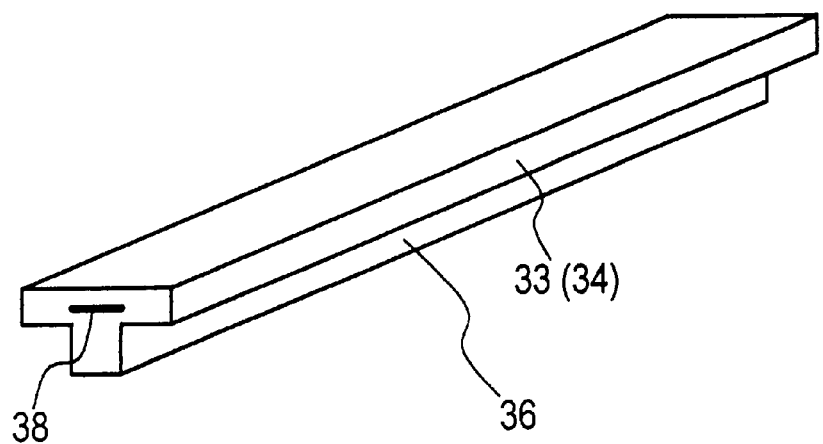
FIG. 10 is a perspective view which shows a part of the supporting section which is used with the infrared sensor element to which microbridge structure according to the fourth preferred embodiment of the present invention is applied.

Next, the microbridge structure according to the fourth preferred embodiment of the present invention will be described with reference to FIG. 10. FIG. 10 is a cross sectional perspective view to explain the supporting section which is used in the fourth embodiment. As seen from FIG. 10, the supporting sections 33 and 34 have the cross section of a T character shape. The pattern 38 which is provided for each supporting section 33 or 34 is embedded in the T character shape. The reinforcement section 36 having the T character shape is provided in the peripheral section of the sensor section. The sensor resistance pattern is exposed in the center section of the sensor section which is surrounded by the reinforcement section 36 having the T character shape. As a result, even if the reinforcement section 36 is formed around the sensor section, the reinforcement section does not prevent the operation of the sensor section. In this way, the sensor section as the thin film section is improved in strength. It should be noted that the sensor resistor pattern may be embedded in the sensor section.

The present invention can be applied to sensors of all non-cooling types such as a pyroelectric type and a thermocouple type, in addition to the infrared sensor of the bolometer type which has been described above.

Also, the present invention can be widely applied to the microbridge structure in which the thin film section spaced from the substrate is supported on the substrate by the supporting sections, and is not limited to the non-cooling type infrared sensor element.

Also, as described above, the present invention is described taking a surface micromachine structure as an example. However, it could be seen that the structure of the present invention can be applied to a bulk micromachine structure.

As described above, according to the microbridge structure of the present invention in which the thin film section spaced from the substrate is supported on the substrate by the supporting sections, since the supporting section is formed with the reinforcement step, the strength of the microbridge structure can be improved. Therefore, the supporting section can be made thinner, narrower and longer, and heat insulation of the thin film section can be improved.

Also, if the reinforcement step is also provided along the entire periphery of thin film section, the strength of the microbridge structure can be further improved. By this, the thin film section can be made thinner, and the reduction of thermal capacity of the thin film section can be accomplished. Although there have been described what are at present considered to be the preferred embodiment of the invention, it will be understood that variations and modifications may be mad thereto without departing form the gist, spirit or essence of the invention. The scope of the invention is indicated by the appended claims.

What is claimed is:

1. A microbridge structure comprising:
   a thin film section adapted to be placed in spaced relation to a substrate;
   two supporting members, wherein each of said two supporting members has first and second sections;
   each of said first sections being connected at one end thereof to said thin film section to support said thin film section, formed around said thin film section in spaced relation to said thin film section in a first portion other than said one end, and disposed in spaced relation to the substrate;
   said second sections extending downward from said first portions, respectively, to connect said first sections to said substrate; and
   a reinforcement section adapted to enforce said thin film section and said two supporting members.

2. A microbridge structure according to claim 1, wherein said reinforcement section includes a reinforcement portion provided around said thin film section to enforce said thin film section.

3. A microbridge structure according to claim 1, wherein said reinforcement section includes a stepped section which is provided to one side of each of said supporting members in a longitudinal direction.

4. A microbridge structure according to claim 1, wherein said reinforcement section includes stepped sections which are provided to both sides of each of said supporting members in a longitudinal direction.

5. A microbridge structure comprising:

a thin film section adapted to be placed in spaced relation to a substrate;

two supporting members, wherein each of said two supporting members has first and second sections;

each of said first sections being connected at one end thereof to said thin film section to support said thin film section, formed around said thin film section in spaced relation to said thin film section in a portion other than said one end, and disposed in spaced relation to the substrate; and a reinforcement section is formed as a unit with each of said two supporting members to have an inverted T-shaped cross section for enforcement of said two supporting members.

6. A microbridge structure comprising:

a thin film section adapted to be placed in spaced relation to a substrate;

two supporting members, wherein each of said two supporting members has first and second sections;

each of said first sections being connected at one end thereof to said thin film section to support said thin film section, formed around said thin film section in spaced relation to said thin film section in a portion other than said one end, and disposed in spaced relation to the substrate; and a reinforcement section is formed as a unit with each of said two supporting members to have a T-shaped cross section for enforcement of said two supporting members.

7. A microbridge structure according to claim 2, wherein said reinforcement section includes a protruding section which is provided to protrude in a direction toward the substrate or away from the substrate in at least a part of the thin film section.

8. A microbridge structure comprising:

a thin film section adapted to be placed in spaced relation to a substrate;

a supporting section formed around said thin film section and also adapted to be spaced from the substrate in one portion and extending downward in another portion, for supporting said thin film section;

a first reinforcing means for reinforcing said thin film section; and a second reinforcing means for reinforcing said supporting section.

9. A microbridge structure according to claim 8, wherein said first reinforcing means comprises a reinforcement section provided to a peripheral portion of the thin film section.

10. A microbridge structure according to claim 8, wherein said reinforcing means comprises a reinforcement section is step-shaped and provided to both sides of said supporting section in a longitudinal direction.

11. A microbridge structure according to claim 8, wherein said reinforcing means comprises reinforcement sections are step-shaped and provided to both sides of said supporting section in a longitudinal direction.

12. A microbridge structure comprising:

a thin film section adapted to be placed in spaced relation to a substrate;

a supporting section formed around said thin film section and also adapted to be spaced from the substrate in one portion and extending downward in another portion, for supporting said thin film section;

a first reinforcing means for reinforcing said thin film section; and a second reinforcing means for reinforcing said supporting section;

said second reinforcing means comprises a reinforcement section which is formed as a unit with said supporting section to have an inverted T-shaped cross section.

13. A microbridge structure comprising:

a thin film section adapted to be placed in spaced relation to a substrate;

a supporting section formed around said thin film section and also adapted to be spaced from the substrate in one portion and extending downward in another portion for supporting said thin film section;

first reinforcing means for reinforcing said thin film section; and second reinforcing means for reinforcing said supporting section;

said second reinforcing means comprises a reinforcement section which is formed as a unit with said supporting section to have a T-shaped cross section.

14. A microbridge structure according to claim 8, wherein said reinforcement section is a protruding section which is provided to protrude in a direction toward the substrate or away from the substrate in at least a part of the thin film section.

15. A microbridge structure according to claim 2, wherein said reinforcement section includes a stepped section which is provided to one side of each of said two supporting members in a longitudinal direction.

16. A microbridge structure according to claim 2, wherein said reinforcement section includes stepped sections which are provided to both sides of each of said two supporting members in a longitudinal direction.

17. A microbridge structure according to claim 5, wherein said supporting members include resist patterns, respectively, said resist patterns being embedded centrally within said units, respectively.

18. A microbridge structure according to claim 6, wherein said supporting members include resist patterns, respectively, said resist patterns being embedded centrally within said units, respectively.

19. A microbridge structure according to claim 12, wherein said supporting includes a resist pattern, said resist pattern being embedded centrally within said unit.

20. A microbridge structure according to claim 13, wherein said supporting includes a resist pattern, said resist pattern being embedded centrally within said unit.

21. A microbridge structure according to claim 2, wherein said portion of said reinforcement section provided around said thin film section projects laterally from a peripheral portion of said thin film section.

22. A microbridge structure according to claim 8, wherein said first reinforcement means projects laterally from a peripheral portion of said thin film section.

* * * * *

UNITED STATES PATENT AND TRADEMARK OFFICE
CERTIFICATE OF CORRECTION

PATENT NO.   : 6,165,587
DATED        : December 26, 2000
INVENTOR(S)  : Ken-Ichi Nonaka It is certified that error appears in the above-identified patent and that said Letters Patent is hereby corrected as shown below:

Column 1,
Line 12, change "image microbridge" to -- image --;
Line 14, change "illustrating a sensor" to -- illustrating a microbridge sensor --;
Line 22, before "typically" insert -- are --;
Line 55, change "wed" to -- used --;
Line 56, change "to form to" to -- to form --.

Column 2,
Line 7, change "materials used thereof" to -- limits in materials used therefor --;
Lines 39 and 40, change "reinforcement means" to -- reinforcing means --.

Column 3,
Lines, 42 and 43, change "preferred" to -- preferably --.

Column 4,
Line 4, after "semiconductor" insert -- materials --;
Line 21, change "from" to -- form a --,
Line 50, change "increasing of" to -- increasing --.

Column 5,
Line 4, change "As" to -- as --.

Column 6,
Line, between 26 and 27, before "heat" insert -- the --;
Line, between 28 and 29, change "of thin" to -- of the thin --;
Line, between 32 and 33, begin a new paragraph with "Although";
Line, between 33 and 34, change "embodiment" to -- embodiments --;
Line, between 35 and 36, change "mad" to -- made --; change "form" to -- from --.

UNITED STATES PATENT AND TRADEMARK OFFICE
CERTIFICATE OF CORRECTION

PATENT NO. : 6,165,587
DATED : December 26, 2000
INVENTOR(S) : Ken-Ichi Nonaka

It is certified that error appears in the above-identified patent and that said Letters Patent is hereby corrected as shown below:

Column 8,
Line, between 49 and 50 (claim 19, 2nd line), after "supporting" insert -- section --;
Line, between 52 and 53 (claim 20, 2nd line), after "supporting" insert -- section --.

Signed and Sealed this

Sixth Day of November, 2001

Attest:

*Attesting Officer*

NICHOLAS P. GODICI
*Acting Director of the United States Patent and Trademark Office*